US007463083B2

United States Patent
Pratt et al.

(12) United States Patent
Pratt et al.

(10) Patent No.: US 7,463,083 B2
(45) Date of Patent: *Dec. 9, 2008

(54) NOISE REDUCTION IN DIGITAL SYSTEMS WHEN THE NOISE IS CAUSED BY SIMULTANEOUSLY CLOCKING DATA REGISTERS

(75) Inventors: Nancy H. Pratt, Essex Junction, VT (US); Sebastian Theodore Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/937,559

(22) Filed: Nov. 9, 2007

(65) Prior Publication Data

US 2008/0068073 A1    Mar. 20, 2008

Related U.S. Application Data

(63) Continuation of application No. 11/275,773, filed on Jan. 27, 2006, now Pat. No. 7,317,348.

(51) Int. Cl.
*H03K 5/00* (2006.01)
(52) U.S. Cl. ..................... 327/551; 327/105
(58) Field of Classification Search ......... 327/105–107, 327/551, 147, 156
See application file for complete search history.

(56) References Cited

U.S. PATENT DOCUMENTS

| 5,317,183 | A |   | 5/1994  | Hoffman et al. |
|-----------|---|---|---------|----------------|
| 5,663,966 | A | * | 9/1997  | Day et al. .................. 714/731 |
| 6,134,145 | A |   | 10/2000 | Wong |
| 6,345,380 | B1 |  | 2/2002  | Bonaccio et al. |
| 6,396,313 | B1 |  | 5/2002  | Sheen |
| 2002/0008648 | A1 | | 1/2002 | Colon-Bonet |

OTHER PUBLICATIONS

Office Action {Mail Date: Jul. 14, 2008} U.S. Appl. No.: 11/836,827 - Filing Date Aug. 10, 2007; First Named Inventor: Nancy H. Pratt.

* cited by examiner

*Primary Examiner*—Dinh T. Le
(74) *Attorney, Agent, or Firm*—Schmeiser, Olsen & Watts; Michael J. LeStrange

(57) ABSTRACT

A digital system. The digital system includes (a) a first logic circuit and a second logic circuit, (b) a first register, (c) a second register, (d) a third register, (e) a clock generator circuit, and (f) a controller circuit. The first logic circuit is capable of obtaining first data and sending second data. The second logic circuit is capable of obtaining the second data and sending third data. The clock generator circuit is capable of asserting (i) a first register clock signal at a first time point, (ii) a second register clock signal at a second time point, and (iii) a third register clock signal at a third time point. The controller circuit is capable of (i) determining a fourth time point, (ii) determining a fifth time point, (iii) controlling the clock generator circuit to assert the second register clock signal.

5 Claims, 4 Drawing Sheets

NOISE REDUCTION IN DIGITAL SYSTEMS WHEN THE NOISE IS CAUSED BY SIMULTANEOUSLY CLOCKING DATA REGISTERS

This application is a continuation application claiming priority to Ser. No. 11/275,773, filed Jan. 27, 2006, U.S. Pat. No. 7,317,348 issued Jan. 8, 2008.

BACKGROUND OF THE INVENTION

1. Technical Field

The present invention relates to noise reduction in digital systems, and more specifically, to noise reduction by asserting clock signals at different times.

2. Related Art

In the normal operation of a conventional digital system, simultaneous clocking of registers of the conventional digital system can cause signal noise. Therefore, there is a need for a digital system (and a method for operating the same) in which the noise due to the simultaneous clocking of data registers can be reduced compared to prior art.

SUMMARY OF THE INVENTION

The present invention provides for noise reduction in a digital system when the noise is caused by simultaneously clocking data registers, comprising (a) a first logic circuit and a second logic circuit; (b) a first register electrically coupled to the first logic circuit; (c) a second register electrically coupled to the first logic circuit and the second logic circuit; (d) a third register electrically coupled to the second logic circuit; (e) a clock generator circuit electrically coupled to the first, second, and third registers; and (f) a controller circuit electrically coupled to the clock generator circuit, wherein the first logic circuit is capable of obtaining first data from the first register, processing the obtained first data into second data, and sending the second data to the second register, wherein the second logic circuit is capable of obtaining the second data from the second register, processing the obtained second data into third data, and sending the third data to the third register, wherein the clock generator circuit is capable of asserting a first register clock signal at a first time point to the first register resulting in the first logic circuit obtaining the first data from the first register, wherein the clock generator circuit is further capable of asserting a second register clock signal at a second time point to the second register resulting in the second logic circuit obtaining the second data from the second register, wherein the clock generator circuit is further capable of asserting a third register clock signal at a third time point to the third register, wherein the controller circuit is capable of (i) determining a first processing time for the first logic circuit to obtain the first data, process the obtained first data into the second data, and send the second data to the second register, (ii) determining a second processing time for the second logic circuit to obtain the second data, process the obtained second data into the third data, and send the third data to the third register, (iii) determining a fourth time point after the first time point such that a first time duration between the first time point and the fourth time point is at least the first processing time, (iv) determining a fifth time point before the third time point and after the fourth time point such that a second time duration between the fifth time point and the third time point is at least the second processing time, wherein the fourth time point and the fifth time point define a first clock window, and (v) controlling the clock generator circuit to assert the second register clock signal such that the second time point is within the first clock window.

The present invention provides a digital system operation method, which comprises providing a digital system which includes (a) a first logic circuit and a second logic circuit, (b) a first register electrically coupled to the first logic circuit, (c) a second register electrically coupled to the first logic circuit and the second logic circuit, (d) a third register electrically coupled to the second logic circuit, (e) a clock generator circuit electrically coupled to the first, second, and third registers, and (f) a controller circuit electrically coupled to the clock generator circuit; using the clock generator circuit to assert a first register clock signal at a first time point to the first register; using the clock generator circuit further to assert a second register clock signal at a second time point to the second register; using the clock generator circuit to further assert a third register clock signal at a third time point to the third register; in response to the clock generator circuit asserting the first register clock signal at the first time point to the first register, using the first logic circuit to obtain first data from the first register, process the obtained first data into second data, and send the second data to the second register; in response to the clock generator circuit further asserting the second register clock signal at the second time point to the second register, using the second logic circuit to obtain the second data from the second register, process the obtained second data into third data, and send the third data to the third register; using the controller circuit to (i) determine a first processing time for the first logic circuit to obtain the first data, process the obtained first data into the second data, and send the second data to the second register; (ii) determine a second processing time for the second logic circuit to obtain the second data, process the obtained second data into the third data, and send the third data to the third register; (iii) determine a fourth time point after the first time point such that a first time duration between the first time point and the fourth time point is at least the first processing time; (iv) determine a fifth time point before the third time point and after the fourth time point such that a second time duration between the fifth time point and the third time point is at least the second processing time; wherein the fourth time point and the fifth time point define a first clock window, and (vi) control the clock generator circuit to assert the second register clock signal such that the second time point is within the first clock window.

The present invention provides a digital system, comprising (a) a first logic circuit and a second logic circuit; (b) a first register electrically coupled to the first logic circuit; (c) a second register electrically coupled to the first logic circuit and the second logic circuit; (d) a third register electrically coupled to the second logic circuit; (e) a clock generator circuit electrically coupled to the first, second, and third registers; and (f) a controller circuit electrically coupled to the clock generator circuit, wherein the first logic circuit comprises a fast logic circuit and a slow logic circuit, wherein the fast logic circuit and the slow logic circuit are capable of performing a same function, wherein the first logic circuit is capable of obtaining first data from the first register, processing the obtained first data into second data, and sending the second data to the second register, wherein the second logic circuit is capable of obtaining the second data from the second register, processing the obtained second data into third data, and sending the third data to the third register, wherein the clock generator circuit is capable of asserting a first register clock signal at a first time point to the first register resulting in the first logic circuit obtaining the first data from the first register, wherein the clock generator circuit is further capable of asserting a second register clock signal at a second time point to the second register resulting in the second logic circuit obtaining the second data from the second register, wherein the clock generator circuit is further capable of asserting a third register clock signal at a third time point to the third register, wherein a first plurality of registers receive as input the second register clock signal, wherein a second plurality of registers receive as input the third register clock signal, wherein the controller circuit is capable of (i) determining a first processing time for the first logic circuit to obtain the first data, process the obtained first data into the second data, and send the second data to the second register, (ii) determining a second processing time for the second logic circuit to obtain the second data, process the obtained second data into the third data, and send the third data to the third register, (iii) determining a fourth time point after the first time point such that a first time duration between the first time point and the fourth time point is at least the first processing time, (iv) determining a fifth time point before the third time point and after the fourth time point such that a second time duration between the fifth time point and the third time point is at least the second processing time, wherein the fourth time point and the fifth time point define a first clock window, and (v) controlling the clock generator circuit to assert the second register clock signal such that the second time point is within the first clock window.

The present invention provides a novel digital system (and a method for operating the same) in which the noise due to the simultaneous clocking of data registers can be reduced compared to prior art.

DETAILED DESCRIPTION OF THE INVENTION

Figure 1:
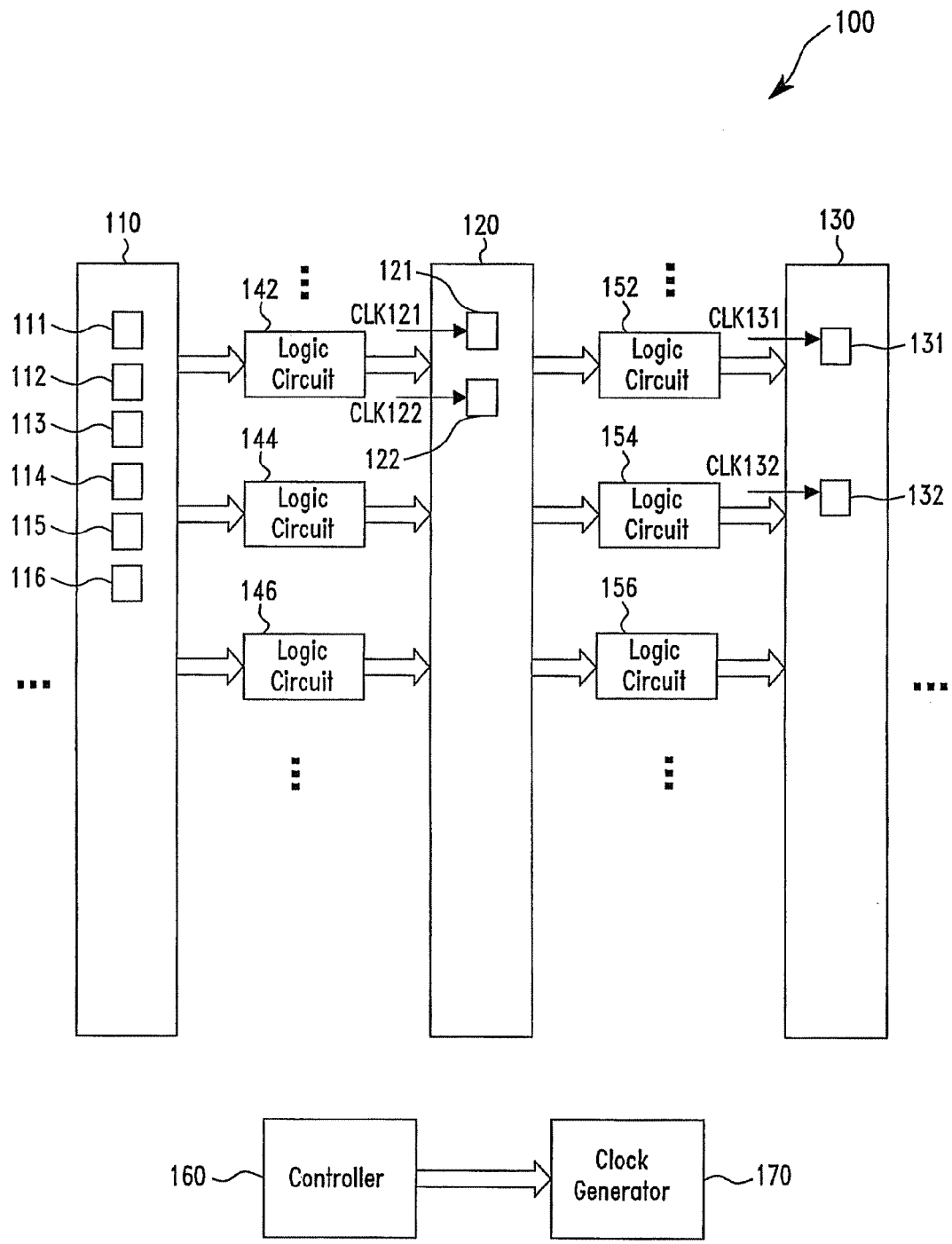
FIG. 1 shows a digital system, in accordance with embodiments of the present invention.

FIG. 1 shows a digital system 100, in accordance with embodiments of the present invention. More specifically, in one embodiment, the digital system 100 comprises multiple register banks (e.g., register banks 110, 120, and 130). Although the digital system 100 has many register banks, only the three register banks 110, 120, and 130 of the digital system 100 are shown in FIG. 1. Illustratively, the register bank 110 comprises multiple registers (e.g., registers 111, 112, 113, 114, 115, and 116). It should be noted that the register bank 110 comprises many registers but only the six registers 111 through 116 are shown in FIG. 1. Similarly, the register banks 120 and 130 comprise multiple registers (e.g., registers 121, 122 of the register bank 120 and registers 131, 132 of the register bank 130). In one embodiment, similarly, the other register banks in the digital system 100 comprise multiple registers. In one embodiment, the digital system 100 further comprises multiple logic circuits electrically coupled between the register banks 110 and 120 (e.g., logic circuits 142, 144, and 146). In one embodiment, the digital system 100 further comprises multiple logic circuits electrically coupled between the register banks 120 and 130 (e.g., logic circuits 152, 154, and 156). In one embodiment, the digital system 100 further comprises a clock generator circuit 170 electrically coupled to the register banks 110, 120 and 130. In one embodiment, each register of each register bank of the digital system 100 receives one clock signal from the clock generator circuit 170. More specifically, in one embodiment, for illustration, the registers 121, 122, 131, and 132 receive clock signals CLK121, CLK122, CLK131, and CLK132, respectively, from the clock generator circuit 170. Although the clock generator circuit 170 generates many clock signals, only the four clock signals CLK121, CLK122, CLK131, and CLK132 are shown in FIG. 1. In one embodiment, the digital system 100 further comprises a controller circuit 160 electrically coupled to the clock generator circuit 170.

Figure 2:
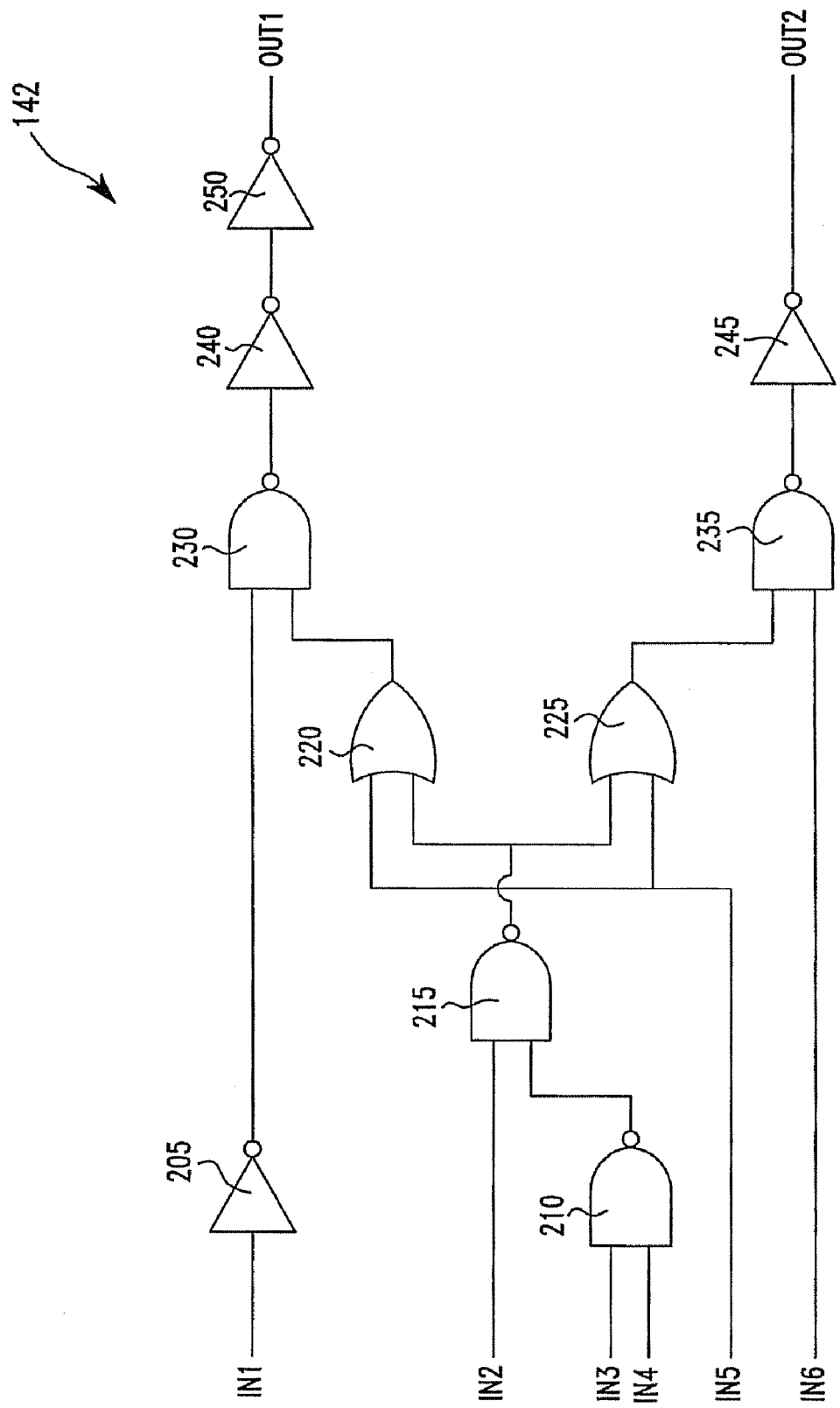
FIG. 2 shows a detail configuration of a logic circuit of the digital system of FIG. 1, in accordance with embodiments of the present invention.

FIG. 2 shows a detail configuration of the logic circuit 142 of FIG. 1, in accordance with embodiments of the present invention. More specifically, in one embodiment, the logic circuit 142 comprises inverters 205, 240, 245, and 250. In one embodiment, the logic circuit 142 further comprises NAND gates 210, 215, 230, 235 and OR gates 220 and 225. In one embodiment, the inverters, NAND gates, and OR gates of the logic circuit 142 are electrically coupled together as shown. As can be seen in FIG. 2, the logic circuit 142 has six inputs IN1, IN2, IN3, IN4, IN 5, IN 6 and two outputs OUT1 and OUT2. In one embodiment, the six input signals IN1, IN2, IN3, IN4, IN 5, and IN 6 come from the six registers 111 through 116 of the register bank 110 of FIG. 1, respectively, and the two output signals OUT1 and OUT2 go to the two registers 121 and 122 of the register bank 120 of FIG. 1, respectively. In one embodiment, similar to the logic circuit 142, each of the other logic circuits of the digital system 100 of FIG. 1 can comprise logic elements (e.g., inverters, NAND gates, and OR gates, etc.) which are electrically coupled together and can have multiple inputs and multiple outputs.

Figure 3:
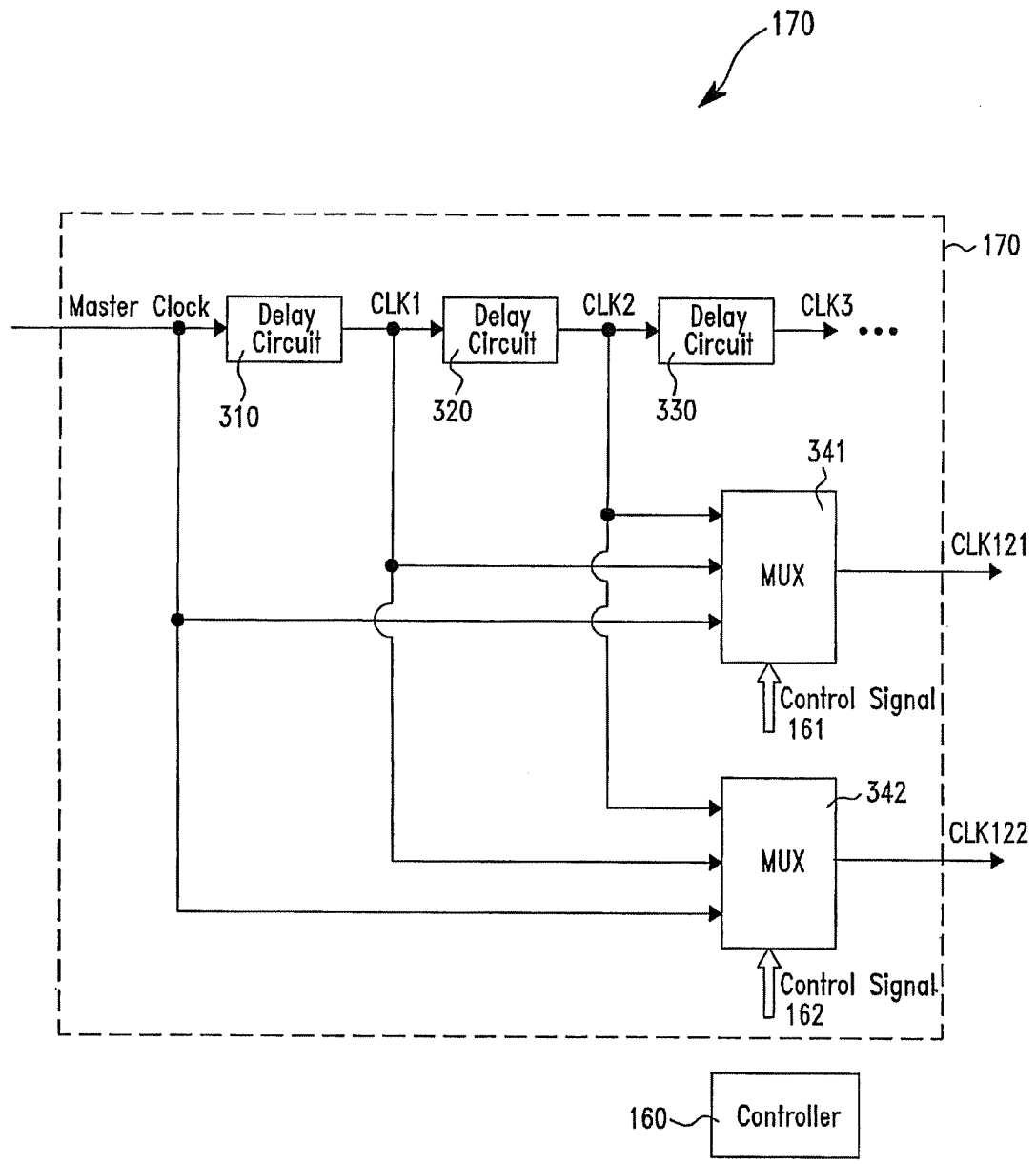
FIG. 3 shows a detail configuration of a clock generator circuit of the digital system of FIG. 1, in accordance with embodiments of the present invention.

FIG. 3 shows a detail configuration of the clock generator circuit 170 of FIG. 1, in accordance with embodiments of the present invention. More specifically, in one embodiment, the clock generator circuit 170 comprises multiple delay circuits (e.g., delay circuits 310, 320, and 330) electrically coupled together in a chain. It should be noted that the clock generator circuit 170 may have many delay circuits but only the three delay circuits 310, 320, and 330 are shown in FIG. 3. In one embodiment, the delay circuit 310 receives a master clock signal and generates a clock signal CLK1 to the delay circuit 320. In one embodiment, the delay circuit 320 receives the clock signal CLK1 from the delay circuit 310 and generates a clock signal CLK2 to the delay circuits 330. Similarly, the delay circuit 330 receives the clock signal CLK2 from the delay circuit 320 and generates a clock signal CLK3. In one embodiment, similarly, the other delay circuits in the chain of the clock generator circuit 170 are coupled in a similar manner. In one embodiment, the clock generator circuit 170 further comprises multiple multiplexer (MUX) circuits (e.g., MUX circuits 341 and 342). Although the clock generator circuit 170 may have many MUX circuits, only the MUX circuits 341 and 342 are shown in FIG. 3 for illustration. The way the other MUX circuits are coupled to the delay circuits of the clock generator circuit 170 will be described later. In one embodiment, the MUX circuits 341 and 342 receive the three clock signals: master clock, CLK1, and CLK2. In one embodiment, the MUX circuits 341 and 342 also receive control signals 161 and 162, respectively, from the controller circuit 160. In one embodiment, the MUX circuits 341 and 342 also generate clock signals CLK121 and CLK122 to the registers 121 and 122 of the register bank 120 of FIG. 1, respectively. It should be noted that the clock signal CLK121 comes from one of the master clock, clock signal CLK1, and clock signal CLK2 depending on the control signal 161. Similarly, the clock signal CLK122 comes from one of the master clock, clock signal CLK1, and clock signal CLK2 depending on the control signal 162. In one embodiment, the remaining MUX circuits of clock generator circuit 170 will generate multiple clock signals one to one to the other registers of FIG. 1.

In one embodiment, with reference to FIGS. 1, 2, and 3, the operation of the digital system 100 is as follows. In one embodiment, to simplify the description of the present invention, assume that one clock cycle of the digital system 100 is one hour. In one embodiment, assume further that in a first clock cycle starting at 8:00 AM, the controller circuit 160 controls the clock generator circuit 170 such that all clock signals going to the registers in FIG. 1 are asserted at a same time (e.g., at 8:00 AM). In response, each of the logic circuits in the digital system 100 obtains data from registers of the register bank on the left, processes the obtained data, and sends the processed data to registers of the register bank on the right. More specifically, for instance, at 8:00 AM the logic circuit 142 obtains data from registers 111 through 116 of the register bank 110, processes the obtained data, and sends the processed data to the registers 121 and 122 of the register bank 120. Assume further that in a second clock cycle starting around 9:00 AM, the logic circuit 152 will obtain the data from the register 121, process the obtained data, and send the processed data to the register 131. Assume further that in the second clock cycle, the logic circuit 154 will obtain the data from the register 122, process the obtained data, and send the processed data to the register 132. Assume further that in a third clock cycle, the clock signals CLK131 and CLK132 will be asserted at 10:00 AM. In one embodiment, the processed data from the logic circuits 152 and 154 will be ready in the registers 131 and 132, respectively, before the clock signals CLK131 and CLK132 are asserted at 10:00 AM. One recognizes that each group of registers is clocked every cycle. For the purpose of this example, data proprogating thru the pipeline is being illustrated.

Assume that the controller circuit 160 determines that the logic circuit 142 takes only 40 minutes to have the processed data ready in the registers 121 and 122. In other words, a first processing time of the logic circuit 142 is 40 minutes. This means that the processed data is ready in the registers 121 and 122 at 8:40 AM. Assume further that the controller circuit 160 determines that the logic circuit 152 and 154 take 45 minutes and 50 minutes to have processed data ready in the registers 131 and 132 of register bank 130, respectively. In other words, a second processing time and a third processing time of the logic circuits 152 and 154 are 45 and 50 minutes, respectively. As a result, the controller circuit 160 determines that a first clock window for the clock signal CLK121 is from 8:40 AM to 9:15 AM (the first clock window is a window in which the clock signal CLK121 can be asserted such that the register 121 has processed data from the logic circuit 142 and the register 131 has processed data before the clock signal CLK131 is asserted at 10:00 AM). Similarly, the controller circuit 160 determines that a second clock window for the clock signal CLK122 is from 8:40 AM to 9:10 AM (the second clock window is a window in which the clock signal CLK122 can be asserted such that the register 122 has processed data from the logic circuit 142 and the register 132 has processed data before the clock signal CLK132 is asserted at 10:00 AM). Therefore, in one embodiment, the controller circuit 160 controls the clock generator circuit 170 to assert the clock signals CLK121 and CLK122 in the first and second clock windows, respectively. This ensures that the processed data from the logic circuits 152 and 154 will be ready in the registers 131 and 132, respectively, before the clock signals CLK131 and CLK132 are asserted at 10:00 AM.

In one embodiment, the controller circuit 160 determines that the clock signal CLK121 will be asserted at 9:00 AM (which is within the first clock window) and the clock signal CLK122 will be asserted at 9:05 AM (which is within the second clock window). Assume that the master clock is asserted at 8:00 AM, 9:00 AM, 10:00 AM, etc. Assume further that each delay circuit (e.g., delay circuit 310, 320, and 330) delays 5 minutes. As a result, the clock signal CLK1 is asserted at 8:05 AM, 9:05 AM, 10:05 AM, etc; the clock signal CLK2 is asserted at 8:10 AM, 9:10 AM, 10:10 AM, etc; and the clock signal CLK3 is asserted at 8:15 AM, 9:15 AM, 10:15 AM, etc.

In one embodiment, for instance, in order to assert the clock signal CLK121 at 9:00 AM, the controller circuit 160 controls the clock generator 170 to generate the control signal 161 so as to cause the MUX circuit 341 to pass the master clock through it as the clock signal CLK121 to the register 131. As a result, the clock signal CLK121 will be asserted at 9:00 AM which is in the first clock window. This ensures that the processed data from the logic circuit 152 will be ready in the register 131 of the register bank 130 before the clock signal CLK131 is asserted at 10:00 AM.

In one embodiment, similarly, in order to assert the clock signal CLK122 at 9:05 AM, the controller circuit 160 controls the clock generator 170 to generate a control signal 162 so as to cause the MUX circuit 342 to pass the clock signal CLK1 through it as the clock signal CLK122 to the register 132. As a result, the clock signal CLK122 will be asserted at 9:05 AM which is in the second clock window. This ensures that the processed data from the logic circuit 154 will be ready in the register 132 of the register bank 130 before the clock signal CLK132 is asserted at 10:00 AM.

In summary, the clock signals CLK121 and CLK122 are asserted at different times for the second clock cycle (9:00 AM and 9:05 AM, respectively). As a result, noise is reduced.

In one embodiment, the controller circuit 160 of FIG. 1 is a state machine. In an alternative embodiment, the controller circuit 160 of FIG. 1 contains a microcode that helps the controller circuit 160 perform its functions described above.

In the embodiment described above, it is assumed that the process data is ready in the registers 121 and 122 at the same time. In an alternative embodiment, it takes different processing times to have processed data ready in the registers 121 and 122.

In the embodiment described above, with reference to FIG. 3, each of the MUX circuit 341 and 342 receive the three clock signals: master clock, CLK1, and CLK2. Alternatively, each of the MUX circuit 341 and 342 can receive N clock signals, N being positive integer. For example, the MUX circuit 341 can receive clock signals CLK1, CLK2, CLK3, and CLK4; and the MUX circuit 342 can receive clock signals CLK1, CLK3, CLK6, and CLK11. As a result, the clock signal CLK121 can be asserted at either 9:05 AM, 9:10 AM, 9:15 AM or 9:20 AM for the second clock cycle around the start of the second clock cycle. Similarly, the clock signal CLK122 can be asserted at either 9:05 AM, 9:15 AM, 9:30 AM or 9:55 AM for the second clock cycle around the start of the second clock cycle.

In the embodiments described above, each register of digital system 100 of FIG. 1 receives a clock signal from the clock generator circuit 170. In an alternative embodiment, the registers of one register bank of the digital system 100 are divided into group, wherein each group receives one clock signal from the clock generator circuit 170. For example, the registers 111 through 116 can be grouped together, and receive the same clock signal from the clock generator circuit 170.

Figure 4:
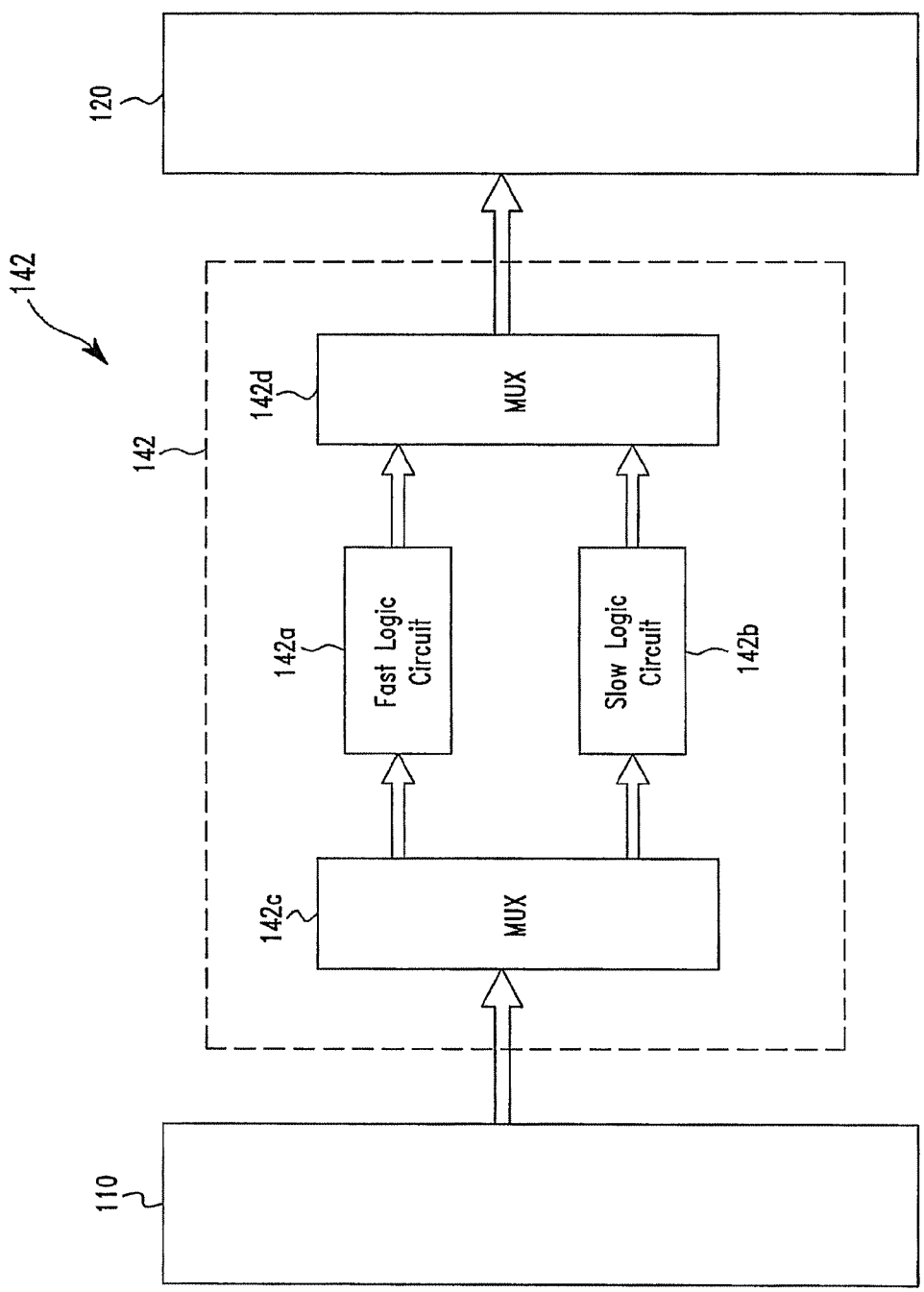
FIG. 4 shows a detail configuration of another embodiment of the logic circuit of the digital system of FIG. 1, in accordance with embodiments of the present invention.

FIG. 4 shows a detail configuration of another embodiment of the logic circuit 142 of FIG. 1, in accordance with embodiments of the present invention. More specifically, in one embodiment, the logic circuit 142 comprises a fast logic circuit 142a, a slow logic circuit 142b, a MUX circuit 142c, and a MUX circuit 142d, which are electrically coupled together as shown. It should be noted that the MUX circuits 142c and 142d receive control signals (not shown) from the controller circuit 160. In one embodiment, the fast logic circuit 142a and the slow logic circuit 142b perform the same function, but the fast logic circuit 142a is faster than the slow logic circuit 142b in performing the function. However, the fast logic circuit 142a consumes more energy than the slow logic circuit 142b. In one embodiment, the other logic circuits of the digital system 100 have similar structure as the logic circuit 142 of FIG. 4. In one embodiment, in each particular clock cycle, one of the fast logic circuit 142a and the slow logic circuit 142b is selected by the controller circuit 160 to obtain data from the registers 111 through 116 of register bank 110 via the MUX circuit 142c, processes the obtained data, and sends the processed data to the registers 121 and 122 of register bank 120 via the MUX circuit 142d. The non-selected circuit of the fast logic circuit 142a and the slow logic circuit 142b does not operate (does not consume energy).

In the embodiments described above, with reference to FIGS. 1, 3, and 4, in the first clock cycle, the controller circuit 160 can select the fast logic circuit 142a to operate (the slow logic circuit 142b does not operate). As a result, the first and the second clock window are wider than the case in which the controller circuit 160 selects the slow logic circuit 142b to operate.

In summary, in operation processing of the digital system 100 of FIG. 1, the times at which the clock signals CLK121 and CLK122 are asserted can be spread out. As a result, noise is reduced.

In the embodiments described above, for simplicity, it is assumed that the controller circuit 160 causes the clock generator circuit 170 to simultaneously assert the clock signals to all the registers of the digital system 100 at 8:00 AM and again at 10:00 AM. Only at around 9:00 AM, the clock signals to the registers are asserted at different times. More specifically, the clock signal CLK121 to the register 121 is asserted at 9:00 AM and the clock signal CLK122 to the register 122 is asserted at 9:05 AM. In an alternative embodiment, the clock signals to the registers of the digital system 100 are asserted at different times around any clock cycle boundary including around 8:00 AM and 10:00 AM.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A digital system, comprising:
   (a) a first logic circuit and a second logic circuit;
   (b) a first register electrically coupled to the first logic circuit;
   (c) a second register electrically coupled to the first logic circuit and the second logic circuit;
   (d) a third register electrically coupled to the second logic circuit;
   (e) a clock generator circuit electrically coupled to the first, second, and third registers; and
   (f) a controller circuit electrically coupled to the clock generator circuit,
   wherein the first logic circuit is capable of obtaining first data from the first register, processing the obtained first data into second data, and sending the second data to the second register,
   wherein the second logic circuit is capable of obtaining the second data from the second register, processing the obtained second data into third data, and sending the third data to the third register,
   wherein the clock generator circuit is capable of asserting a first register clock signal at a first time point to the first register resulting in the first logic circuit obtaining the first data from the first register,
   wherein the clock generator circuit is further capable of asserting a second register clock signal at a second time point to the second register resulting in the second logic circuit obtaining the second data from the second register,
   wherein the clock generator circuit is further capable of asserting a third register clock signal at a third time point to the third register,
   wherein the controller circuit is capable of
      (i) determining a first processing time for the first logic circuit to obtain the first data, process the obtained first data into the second data, and send the second data to the second register,
      (ii) determining a second processing time for the second logic circuit to obtain the second data, process the obtained second data into the third data, and send the third data to the third register,
      (iii) determining a fourth time point after the first time point such that a first time duration between the first time point and the fourth time point is at least the first processing time,
      (iv) determining a fifth time point before the third time point and after the fourth time point such that a second time duration between the fifth time point and the third time point is at least the second processing time,
         wherein the fourth time point and the fifth time point define a first clock window, and
      (v) controlling the clock generator circuit to assert the second register clock signal such that the second time point is within the first clock window.

2. The digital system of claim 1, further comprising:
   (a) a third logic circuit;
   (b) a fourth register electrically coupled to the first logic circuit and the third logic circuit; and
   (c) a fifth register electrically coupled to the third logic circuit,
   wherein the first logic circuit is further capable of processing the obtained first data into fourth data and sending the fourth data to the fourth register,
   wherein the third logic circuit is capable of obtaining the fourth data from the fourth register, processing the obtained fourth data into fifth data, and sending the fifth data to the fifth register,
   wherein the clock generator circuit is further capable of asserting a fourth register. clock signal at a sixth time point to the fourth register resulting in the third logic circuit obtaining the fourth data from the fourth register,
   wherein the clock generator circuit is further capable of asserting a fifth register clock signal at the third time point to the fifth register, wherein the controller circuit is further capable of (i) determining a third processing time for the first logic circuit to obtain the first data, process the obtained first data into the fourth data, and send the fourth data to the fourth register, (ii) determining a fourth processing time for the third logic circuit to obtain the fourth data, process the obtained fourth data into the fifth data, and send the fifth data to the fifth register, (iii) determining a seventh time point after the first time point such that a third time duration between the first time point and the seventh time point is at least the third processing time, (iv) determining an eighth time point before the third time point and after the seventh time point such that a fourth time duration between the eighth time point and the third time point is at least the fourth processing time, wherein the seventh time point and the eighth time point define a second clock window, and (v) controlling the clock generator circuit to assert the fourth register clock signal such that the six time point is within the second clock window, and such that the second time point and the six time point do not coincide.

3. The digital system of claim 1, wherein the controller circuit comprises a state machine.

4. A digital system, comprising:
(a) a first logic circuit and a second logic circuit;
(b) a first register electrically coupled to the first logic circuit;
(c) a second register electrically coupled to the first logic circuit and the second logic circuit;
(d) a third register electrically coupled to the second logic circuit;
(e) a clock generator circuit electrically coupled to the first, second, and third registers; and
(f) a controller circuit electrically coupled to the clock generator circuit, wherein the first logic circuit comprises a fast logic circuit and a slow logic circuit, wherein the fast logic circuit and the slow logic circuit are capable of performing a same function, wherein the first logic circuit is capable of obtaining first data from the first register, processing the obtained first data into second data, and sending the second data to the second register, wherein the second logic circuit is capable of obtaining the second data from the second register, processing the obtained second data into third data, and sending the third data to the third register, wherein the clock generator circuit is capable of asserting a first register clock signal at a first time point to the first register resulting in the first logic circuit obtaining the first data from the first register, wherein the clock generator circuit is further capable of asserting a second register clock signal at a second time point to the second register resulting in the second logic circuit obtaining the second data from the second register, wherein the clock generator circuit is further capable of asserting a third register clock signal at a third time point to the third register, wherein a first plurality of registers receive as input the second register clock signal, wherein a second plurality of registers receive as input the third register clock signal, wherein the controller circuit is capable of
(i) determining a first processing time for the first logic circuit to obtain the first data, process the obtained first data into the second data, and send the second data to the second register, (ii) determining a second processing time for the second logic circuit to obtain the second data, process the obtained second data into the third data, and send the third data to the third register, (iii) determining a fourth time point after the first time point such that a first time duration between the first time point and the fourth time point is at least the first processing time, (iv) determining a fifth time point before the third time point and after the fourth time point such that a second time duration between the fifth time point and the third time point is at least the second processing time, wherein the fourth time point and the fifth time point define a first clock window, and (v) controlling the clock generator circuit to assert the second register clock signal such that the second time point is within the first clock window.

5. The digital system of claim 4, wherein the controller circuit comprises a state machine.

* * * * *